United States Patent [19]

Joardar

[11] Patent Number: 5,936,454
[45] Date of Patent: Aug. 10, 1999

[54] LATERAL BIPOLAR TRANSISTOR OPERATING WITH INDEPENDENT BASE AND GATE BIASING

[75] Inventor: Kuntal Joardar, Chandler, Ariz.

[73] Assignee: Motorola, Inc., Schaumburg, Ill.

[21] Appl. No.: 08/069,803

[22] Filed: Jun. 1, 1993

[51] Int. Cl.$^6$ ................................................ H03K 17/60
[52] U.S. Cl. .......................................... 327/432; 327/434
[58] Field of Search ................................ 307/570, 573, 307/574, 304, 270; 257/60; 327/432, 434, 427

[56] References Cited

U.S. PATENT DOCUMENTS

| | | | |
|---|---|---|---|
| 3,639,813 | 2/1972 | Kamoshida et al. ................ | 257/260 |
| 3,688,165 | 8/1972 | Tominaga et al. .................. | 257/260 |
| 4,263,518 | 4/1981 | Ballatore et al. ................... | 257/260 |
| 4,551,643 | 11/1985 | Russell et al. ..................... | 307/570 |
| 4,605,872 | 8/1986 | Rung .................................. | 307/570 |
| 4,672,245 | 6/1987 | Majumdar et al. ................. | 307/574 |
| 4,872,042 | 10/1989 | Maeda et al. ...................... | 257/260 |
| 4,901,127 | 2/1990 | Chow et al. ....................... | 307/570 |
| 5,091,664 | 2/1992 | Furuhata ............................ | 307/270 |
| 5,237,211 | 8/1993 | Tanaka et al. ..................... | 307/570 |

*Primary Examiner*—Toan Tran
*Attorney, Agent, or Firm*—Robert D. Atkins

[57] ABSTRACT

A laterally formed bipolar transistor receives independent base biasing at a base terminal and gate biasing at a gate terminal for providing high forward current gain and improved frequency response. The collector and emitter are formed with a first conductivity type and disposed in a well having a second conductivity type. The gate of the lateral transistor is formed adjacent to the well between the collector and emitter and receives the gate bias. The base of the lateral transistor is formed adjacent to the well and receiving the base bias. The combination of independent base and gate biasing provides more mobile carries to improve the forward current gain and frequency response of the lateral transistor while reducing its overall area.

5 Claims, 1 Drawing Sheet

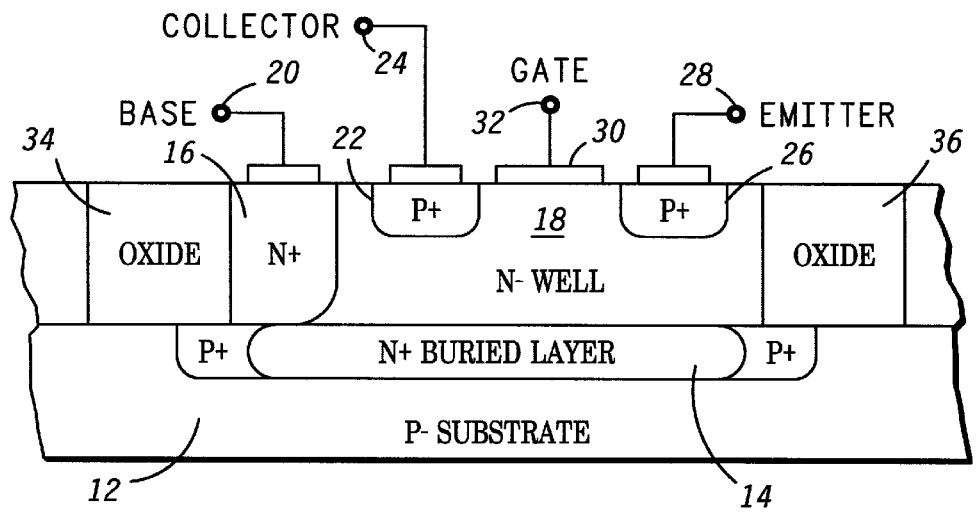
Fig. 1
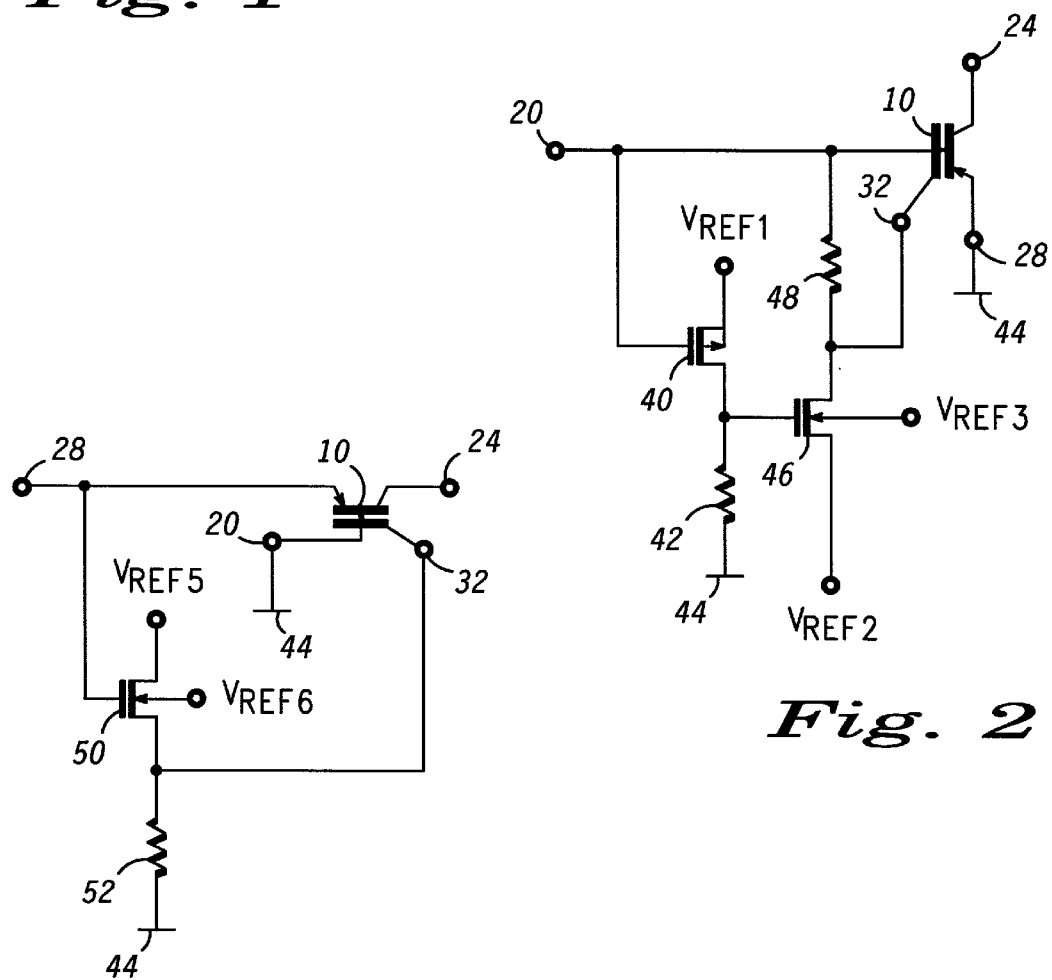
Fig. 2
Fig. 3

LATERAL BIPOLAR TRANSISTOR OPERATING WITH INDEPENDENT BASE AND GATE BIASING

BACKGROUND OF THE INVENTION

The present invention relates in general to lateral transistors and, more particularly, to a lateral transistor operating in bipolar mode with independent base and gate biasing.

The two most common methods of forming a transistor is to lay out the device in a vertical configuration or a lateral configuration. A vertical transistor has the advantage of superior forward current gain, β, and a wider frequency response when compared to the performance characteristics of a laterally formed transistor. A principle disadvantage of the vertically formed transistor is the complexity of the manufacturing process in that the regions comprising the collector and emitter must be formed at different times using carefully controlled thermal processes. The spatial separation between the emitter and collector in the bipolar transistor is also critical. In vertical transistors, this dimension is defined by thermal cycles. In laterally formed transistors, it is determined by photolithography.

A laterally formed transistor has the advantage of simplified manufacturing by forming the collector and emitter regions at the same time. Unfortunately, the lateral bipolar transistor suffers from poor forward current gain, on the order of 5 to 10, and a limited frequency response. Moreover, the forward current gain in the lateral transistor tends to decrease at relatively low values of collector current.

Hence, a need exists for an improved lateral transistor having high forward current gain over a broad range of frequencies and collector currents.

BRIEF DESCRIPTION OF THE DRAWING

FIG. 1 illustrates the layout of a lateral transistor with independent gate and base contacts;

FIG. 2 is a schematic diagram illustrating a bias circuit for the gate of the lateral transistor; and FIG. 3 is a schematic diagram illustrating an alternate embodiment of the gate bias circuit.

DETAILED DESCRIPTION OF THE PREFERRED EMBODIMENT

A lateral PNP bipolar transistor 10 is shown in FIG. 1 having a p-substrate 12 formed below n+ buried layer 14. A region 16 composed of n+ conductivity material is formed adjacent to n-well 18 composed of a n-type conductivity material. A base contact 20 is connected to n+ region 16 for good ohmic contact to n-well 18. A region 22 composed of p+ conductivity material is formed in n-well 18 and includes collector contact 24. Similarly, region 26 composed of p+ conductivity material is formed in n-well 18 with emitter contact 28. Thus, p+ region 22 operates as the collector of lateral PNP bipolar transistor 10 while p+ region 26 operates as the emitter and n-well 18 forms the base region. A gate 30 is formed above the base between p+ region 22 and p+ region 26 composed of a silicon divide layer adjacent to n-well 18 and a polysilicon layer to which gate contact 32 is connected. Oxide regions 34 and 36 surround lateral PNP transistor 10 as shown.

The operation of lateral PNP transistor 10 proceeds as follows. When a base voltage is applied to n+ region 16, n-well 18 (base) becomes forward biased with respect to p+ region 26 (emitter) causing p-type minority carries to flow into the base and form a conduction path from p+ region 26 to p+ region 22 (collector). As part of the present invention, in a PNP configuration, a gate potential less than the flatband voltage is simultaneously applied at gate contact 32 to generate additional p-type minority carriers between p+ region 26 and p+ region 22. The flatband voltage is that voltage required on gate 30 with respect to n-well region 18 to neutralize any charges induced in n-well region 18 due to the presence of gate 30. In the PNP configuration, the gate potential may be 0.20 volts or less, while the flatband voltage is 0.30 volts. Thus, the gate potential enhances the supply of holes from p+ region 26 to p+ region 22. In an NPN configuration, the gate potential would be greater than the flatband voltage.

The advantage of having simultaneous gate and base biasing is to facilitate the conduction between collector contact 24 and emitter contact 28. By selecting the proper gate bias as described below, the collector current and forward current gain β may be chosen at a given bias setting independent of process and geometry. Moreover, the problem of decreasing β with an increasing collector current is eliminated by adjusting the gate bias to compensate for any loss of mobile carriers at high collector currents. By decreasing the gate potential below the flatband voltage, the n-type region between p+ region 22 and p+ region 26 is more conducive to current flow near the surface of n-well 18 with more mobile carriers. The improved frequency response results from the fact that with independent gate and base biasing arrangement a smaller sized transistor can provide the same collector current as a larger bipolar transistor operating without the separate gate biasing. The reduced transistor size lowers the associated capacitance and thereby improves its frequency response.

PNP transistor 10 is schematically shown in FIG. 2 in a common-emitter configuration with a biasing circuit responsive to the base voltage for generating a gate potential to aid in current conduction between collector contact 24 and emitter contact 28. Circuit elements in FIGS. 2–3 having the same reference number as used in FIG. 1 perform the same function. Transistor 40 includes a gate coupled to base terminal 20 and a drain receiving a reference potential $V_{REF1}$ operating at say 1.25 volts. The substrate contact of transistor 40 also receives $V_{REF1}$. The source of transistor 40 is coupled through resistor 42 to power supply conductor 44 operating at ground potential. Emitter contact 28 of transistor 10 is typically coupled to ground potential in a common-emitter configuration. The drain of transistor 46 is coupled through resistor 48 to base terminal 20 and develops the gate potential for transistor 10. The source of transistor 46 receives reference potential $V_{REF2}$ operating at say −1.25 volts. A reference potential $V_{REF3}$ of −5 volts is applied to the substrate of transistor 46.

A negative voltage, less than 0.20, is applied at the base terminal 20 to enable conduction through transistor 40 and establish a positive voltage at the gate of transistor 46. A decrease in base voltage causes more current to flow through transistor 40 and increases the positive potential at the gate of transistor 46. A higher gate potential for transistor 46 increases the current flow through resistor 48 and decreases the potential at gate terminal 32 of transistor 10 with respect to its base. Thus, a decrease in base potential, and correspondingly, an increase in base current to lateral PNP transistor 10 produces a more negative gate voltage for transistor 10 with respect to its base so as to enhance the collector current and maintain a constant forward current gain β.

Referring back to FIG. 1, a more negative gate potential at gate terminal 32 aids in the conduction between collector contact 24 and emitter contact 28 by supplying more p-type carriers. Without the gate biasing circuit, an increase in the base current does not increase the collector current by the same proportion. Instead, the forward current gain β drops as the ratio of collector current to base current. In accordance with the present invention, the independent gate bias as applied to gate 30 boosts the collector current to maintain a constant forward current gain β.

Returning to FIG. 3, an alternate embodiment of the gate biasing circuit for a common-base configuration for lateral PNP transistor 10 is shown. Transistor 50 includes a drain receiving reference potential $V_{REF5}$ operating at −0.5 volts, and a source coupled through resistor 52 to power supply conductor 44. The substrate region of transistor 50 receives reference potential $V_{REF6}$ operating at −5 volts. The potential developed across resistor 52 provides the gate potential for transistor 10. Transistor 50 is responsive to the emitter potential of transistor 10 to decrease the gate potential of transistor 10 with respect to its base upon detecting an increasing emitter voltage. Alternately, if the emitter voltage decreases, transistor 50 conducts less current and develops less potential across resistor 52 thereby resulting in less gate potential at gate terminal 32 for transistor 10.

Thus, using independent base biasing and gate biasing for lateral PNP bipolar transistor 10 results in higher forward current gain that can be maintained at higher collector currents. The same technique may be applied to lateral NPN transistors. Another advantage of using simultaneous base biasing and gate biasing is a reduction in the overall area of transistor 10 and the gate biasing circuit. The decrease in area requirement also reduces associated gate capacitance and improves the frequency performance of transistor 10.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A first transistor, comprising a collector, an emitter, a base and a gate, said base being coupled for receiving a base signal, said gate being coupled for receiving a gate signal, said collector and emitter forming a conduction path through the first transistor in response to said base signal, said gate enhancing the supply of mobile carriers between said collector and emitter to facilitate conduction through the first transistor.

2. A circuit, comprising:
   a first transistor having a collector, an emitter, a base and a gate, said base receiving a base signal, said gate receiving a gate signal, said collector and emitter forming a conduction path in response to said gate signal and said base signal; and
   circuit means responsive to said base signal for providing said gate signal to said gate of said first transistor.

3. The circuit of claim 2 wherein said circuit means includes:
   a second transistor having a gate, a drain and a source, said gate being coupled to said base of said first transistor, said drain receiving a first reference potential;
   a first resistor coupled between said source of said second transistor and a first power supply conductor;
   a third transistor having a gate, a drain and a source, said gate being coupled to said source of said second transistor, said source receiving a second reference potential, said drain being coupled to said gate of said first transistor for providing said gate signal; and
   a second resistor coupled between said drain of said third transistor and said base of said first transistor.

4. A circuit, comprising:
   a transistor having a collector, an emitter, a base electrode and a gate electrode, said base electrode receiving a base signal, said gate electrode receiving a gate signal, said collector and emitter forming a conduction path through the transistor in response to said base signal, said gate signal enhancing the supply of mobile carriers between said collector and emitter to facilitate conduction through the transistor; and
   circuit means responsive to said base signal for providing said gate signal to said gate of said transistor.

5. A circuit, comprising:
   a first transistor having a collector, an emitter, a base and a gate, said base receiving a base signal, said gate receiving a gate signal, said collector and emitter forming a conduction path in response to said gate signal and said base signal; and
   a bias circuit having an input coupled to said emitter of said first transistor and an output coupled to said gate of said first transistor for providing said gate signal, said bias circuit including,
   (a) a second transistor having a gate, a drain and a source, said gate being coupled to said emitter of said first transistor, said drain receiving a first reference potential, said source being coupled to said gate of said first transistor for providing said gate signal, and
   (b) a first resistor coupled between said source of said second transistor and a first power supply conductor.

* * * * *